(12) United States Patent
Hirayama

(10) Patent No.: US 8,782,111 B2
(45) Date of Patent: Jul. 15, 2014

(54) DIGITAL FILTER

(75) Inventor: Hideki Hirayama, Gifu-ken (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 420 days.

(21) Appl. No.: 13/155,869

(22) Filed: Jun. 8, 2011

(65) Prior Publication Data

US 2011/0307537 A1 Dec. 15, 2011

(30) Foreign Application Priority Data

Jun. 10, 2010 (JP) ................. 2010-132776

(51) Int. Cl.
G06F 17/10 (2006.01)
H03H 17/02 (2006.01)
H03H 17/04 (2006.01)

(52) U.S. Cl.
CPC ........... H03H 17/04 (2013.01); H03H 17/0202 (2013.01)
USPC ....................................................... 708/320

(58) Field of Classification Search
None
See application file for complete search history.

(56) References Cited

U.S. PATENT DOCUMENTS

| 7,856,179 | B2 * | 12/2010 | Hirayama | ........................ 396/55 |
| 8,166,087 | B2 * | 4/2012 | Matsuyama et al. | .......... 708/320 |
| 2002/0035587 | A1 * | 3/2002 | Zimpfer et al. | ................ 708/320 |
| 2008/0120356 | A1 * | 5/2008 | Watanabe | ...................... 708/320 |
| 2009/0030961 | A1 * | 1/2009 | Matsuyama et al. | .......... 708/320 |
| 2010/0265343 | A1 * | 10/2010 | Lee et al. | ................... 348/208.7 |
| 2011/0279692 | A1 * | 11/2011 | Hirayama | .................. 348/208.2 |
| 2011/0307537 | A1 * | 12/2011 | Hirayama | ..................... 708/301 |

FOREIGN PATENT DOCUMENTS

JP 2008-061053 A 3/2008

OTHER PUBLICATIONS espacenet, Patent Abstract for Japanese Publication No. 2008-061053 Published Mar. 13, 2011 (1 page).

* cited by examiner

Primary Examiner — David H Malzahn
(74) Attorney, Agent, or Firm — Patents on Demand, P.A.; Scott M. Garrett; Brian K. Buchheit

(57) ABSTRACT

A digital filter has a plurality of filters, wherein each filter performs coefficient multiplication and delay processing for an input signal and an output signal, obtains the output signal from the input signal, and includes a plurality of coefficient multipliers for multiplying a signal by a predetermined coefficient. The digital filter also includes a plurality of delay circuits for delaying a signal, and an adder for adding a plurality of signals. A first RAM stores a plurality of sets of coefficient data for a plurality of coefficient multipliers of the first filter and stores delay data for the delay circuit of the second filter. A second RAM stores a plurality of sets of coefficient data for a plurality of coefficient multipliers of the second filter and stores delay data for the delay circuit of the first filter.

20 Claims, 6 Drawing Sheets

DIGITAL FILTER

CROSS-REFERENCE TO RELATED APPLICATIONS

The present application claims priority from Japanese Patent Application No. 2010-132776 filed on Jun. 10, 2010. The entire disclosure of Japanese Patent Application No. 2010-132776 filed on Jun. 10, 2010, including specification, claims, drawings, and abstract, is incorporated herein by reference in its entirety.

BACKGROUND OF INVENTION

1. Technical Field

One or more embodiments of the present invention relate to an efficient utilization of memory in a digital filter.

2. Background Art

Digital processing is widely used in various types of signal processing and various types of digital filters are used.

FIG. 2 shows a first-order IIR filter as an example of a digital filter. An input signal In is multiplied by a coefficient a at a coefficient multiplier 10 after which a·In is input by an adder 12. The input signal In is delayed by a delay circuit 14, multiplied by a coefficient b at a coefficient multiplier 16, then input as b·Z1 by the adder 12.

An output of the adder 12 is output as an output signal Out and also delayed by a delay circuit 18, multiplied by a coefficient c at a coefficient multiplier 20, then input as c·Z2 by the adder 12.

Therefore, an operation of Out=a·In +b·Z1+c·Z2 is performed at the digital filter.

Here, coefficient data a, b, c and delay data Z1, Z2 are stored in memory (RAM), such as SRAM, and read therefrom. On the other hand, the operations of (1) a·In, (2) b·Z1, and (3) c·Z2 are performed for the abovementioned operation in one clock cycle. Thus, it is necessary for the coefficient data and the delay data to be respectively read simultaneously.

In this sort of instance, operational efficiency is better in a configuration having separate RAM units where the coefficients a, b, c are stored into a coefficient RAM and the delay data Z1, Z2 are stored into a delay RAM.

Here, when implementing the digital filter in hardware, there is often a restriction (capacity restriction) in the minimum value of RAM capacity. Namely, the RAM is a general-purpose storage member and the use of readily available RAM as a general-purpose circuit is unavoidable because the cost becomes high if one is fabricated for a special purpose. Accordingly, there may be instances where the coefficient RAM and the delay RAM have a capacity larger than necessary.

As a solution, one method uses a dual port SRAM, which is a single RAM capable of being simultaneously read from two ports. However, the dual port SRAM has a large area, which is inefficient, compared to a single port SRAM having the same capacity.

SUMMARY OF THE INVENTION

One or more embodiments of the present invention are a digital filter having a plurality of filters, wherein each filter performs coefficient multiplication and delay processing for an input signal and an output signal, obtains the output signal from the input signal, and includes a plurality of coefficient multipliers for multiplying a signal by a predetermined coefficient, a plurality of delay circuits for delaying a signal, and an adder for adding a plurality of signals; a first memory for storing a plurality of sets of coefficient data for a plurality of coefficient multipliers of a first filter and for storing delay data for the delay circuit of a second filter; and a second memory for storing a plurality of sets of coefficient data for a plurality of coefficient multipliers of the second filter and for storing delay data for the delay circuit of the first filter.

According to one or more embodiments of the present invention, parallel read operations are possible so that efficient utilization of memory can be designed.

DETAILED DESCRIPTION

One or more embodiments of the present invention will be described hereinafter with reference to the attached drawings. In embodiments of the invention, numerous specific details are set forth in order to provide a more thorough understanding of the invention. However, it will be apparent to one with ordinary skill in the art that the invention may be practiced without these specific details. In other instances, well-known features have not been described in detail to avoid obscuring the invention.

Figure 1:
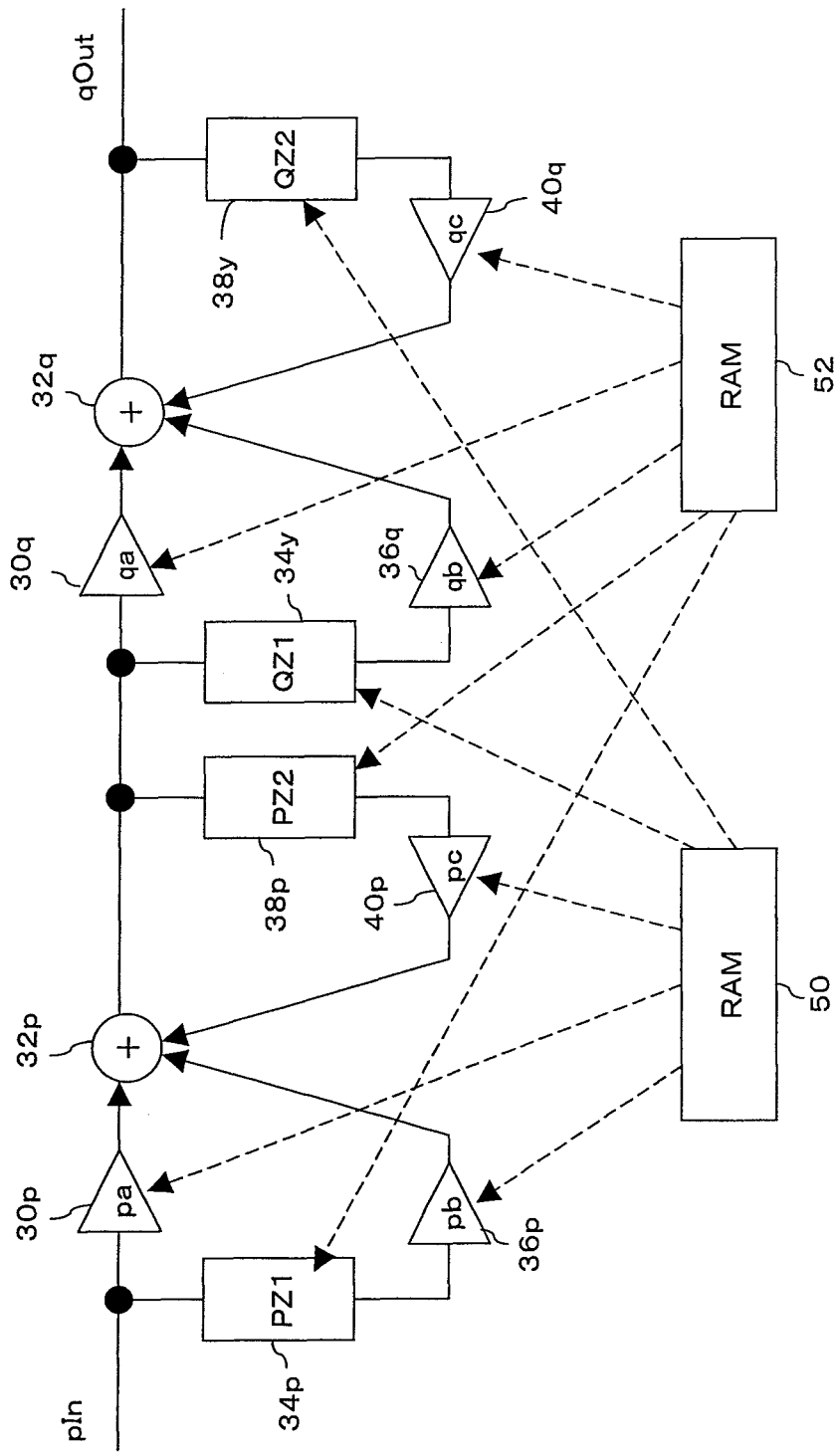
FIG. 1 shows a configuration of two filters according to one or more embodiments of the present invention.
Figure 2:
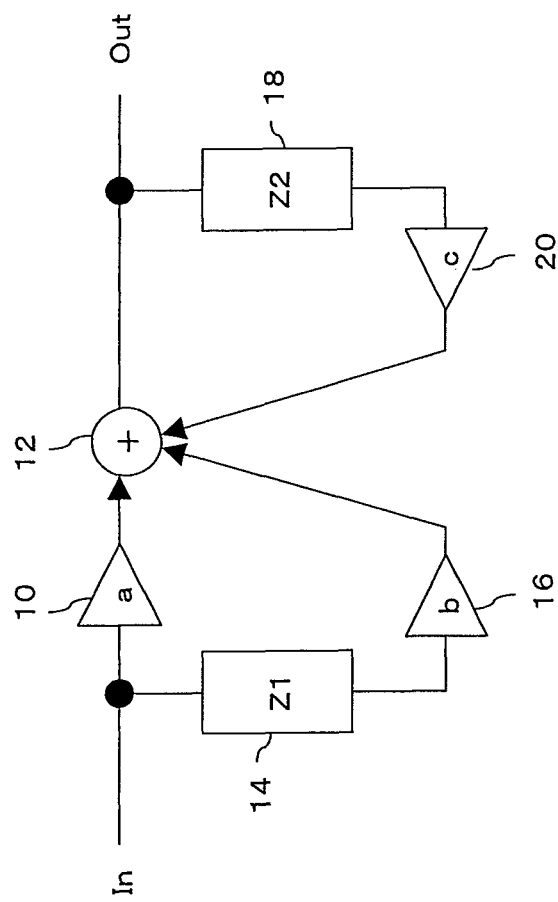
FIG. 2 shows a configuration of a digital filter according to one or more embodiments of the present invention.

FIG. 1 shows a configuration of an embodiment in which two filters are connected in series. It should be noted three or more filters may be connected. Furthermore, a plurality of filters may be configured by using one filter in time division.

An input signal pIn is input by a coefficient multiplier $30p$ where it is multiplied by a coefficient pa and the obtained pa·pIn is input by an adder $32p$. The input signal pIn is also input by a delay circuit $34p$ where it is delayed to become PZ1. The delayed signal PZ1 is multiplied by a coefficient pb at a coefficient multiplier $36p$ and input by the adder $32p$.

An output of the adder $32p$ is output as an output signal pOut and also delayed by a delay circuit $38p$ to become PZ2. The delayed signal PZ2 is multiplied by a coefficient pc at a coefficient multiplier $40p$ and input by the adder $32p$.

Therefore, an operation of pOut=pa·pIn+pb·PZ1+pc·PZ2 is performed at the digital filter. When the current input signal is denoted as $In_n$ and the output signal as $Out_n$, the above expression becomes $pOut_n = pa \cdot pIn_n + pb \cdot pIn_{n-1} + pc \cdot pOut_{n-1}$.

An output of the first-stage filter is input by the filter of the second-stage. The configuration of the second-stage filter is the same as that of the first-stage filter and shown with the suffix letter of each member changed from p to q. Furthermore, with regard to the signals, the signal names are displayed with the prefix letter changed from p to q.

The signal of the second-stage filter is $qIn_n = pOut_n$. Therefore, the second-stage filter performs an operation of $qOut_n = qa \cdot qIn_n + qb \cdot QZ1 + qc \cdot QZ2 = qa \cdot qIn_n + qb \cdot qIn_{n-1} + qc \cdot qOut_{n-1} = qa \cdot pOut_n + qb \cdot pOut_{n-1} + qc \cdot qOut_{n-1}$.

Here, the coefficients a, b, c and the delay data Z1, Z2 are stored in memory (RAM), such as SRAM, and read therefrom. On the other hand, the operations of (1) pa·In$_n$, (2) pb·PZ1, and (3) pc·PZ2 are performed for the first-stage operation in one clock cycle.

In one or more embodiments of the present invention, a RAM 50 and a RAM 52 are two memory units, where each stores coefficient data and delay data of different filters. Namely, the RAM 50 stores coefficients pa, pb, pc and delay data QZ1, QZ2, and the RAM 52 stores coefficients qa, qb, qc and delay data PZ1, PZ2.

Accordingly, when processing in the first-stage filter, operations are performed by reading in parallel the coefficients pa, pb, pc from the RAM 50 and the delay data PZ1, PZ2 from the RAM 52, and when processing in the second-stage filter, operations are performed by reading in parallel the coefficients qa, qb, qc from the RAM 52 and the delay data QZ1, QZ2 from the RAM 50.

Furthermore, although the coefficients pa, pb, pc and the delay data QZ1, QZ2 are stored in the RAM 50 and the coefficients qa, qb, qc and the delay data PZ1, PZ2 are stored in the RAM 52, multiple sets of each are stored. Therefore, when switching coefficients, simply changing the set of the coefficients to be read ordinarily obviates the rewriting of data.

By sequentially performing this process, data can be read in parallel from the RAM 50 and the RAM 52 and processed in the digital filter where two stages are connected. Then, the RAM 50 and the RAM 52 can store only the various patterns of coefficient data required in the respective first-stage filter and the second-stage filter. By storing both the coefficient data and the delay data in this manner, the RAM 50 and the RAM 52 both have a certain capacity so that their capacities can be efficiently used. Furthermore, when changing the coefficients, a selection can be made from among the various coefficient data sets stored in the RAM 50 and the RAM 52 and can be easily adapted also to the switching of the coefficients.

Namely, when it is desired to instantaneously switch the filter characteristics, sequentially changing the coefficients pa, pb, pc of the RAM 50 may cause coefficients to change in mid-operation and cause unpredictable operations. However, preparing multiple sets of coefficients as described hereinabove, such as (pa1, pb1, pc1), (pa2, pb2, pc2), (pa3, pb3, pc3), . . . , and switching to a combination to be used enables applicability to the instantaneous switching of coefficients. This is similar also for RAM 52.

In this manner, the coefficient data and delay data necessary in one filter can be read in parallel from the RAM 50 and the RAM 52 so that high speed processing becomes possible. Furthermore, because the RAM 50 and the RAM 52 store the respective coefficient data and the delay data, the RAM capacities balance out so as to prevent unnecessary free space from occurring, thereby enabling efficient memory utilization.

Such a filter may be used in a filter circuit for camera shake correction. In particular, for processing a detection signal of a gyro for detecting acceleration in multiple directions, a plurality of digital filters (IIR filter) becomes necessary and the abovementioned configuration may be applied to this gyro filter.

Figure 3:
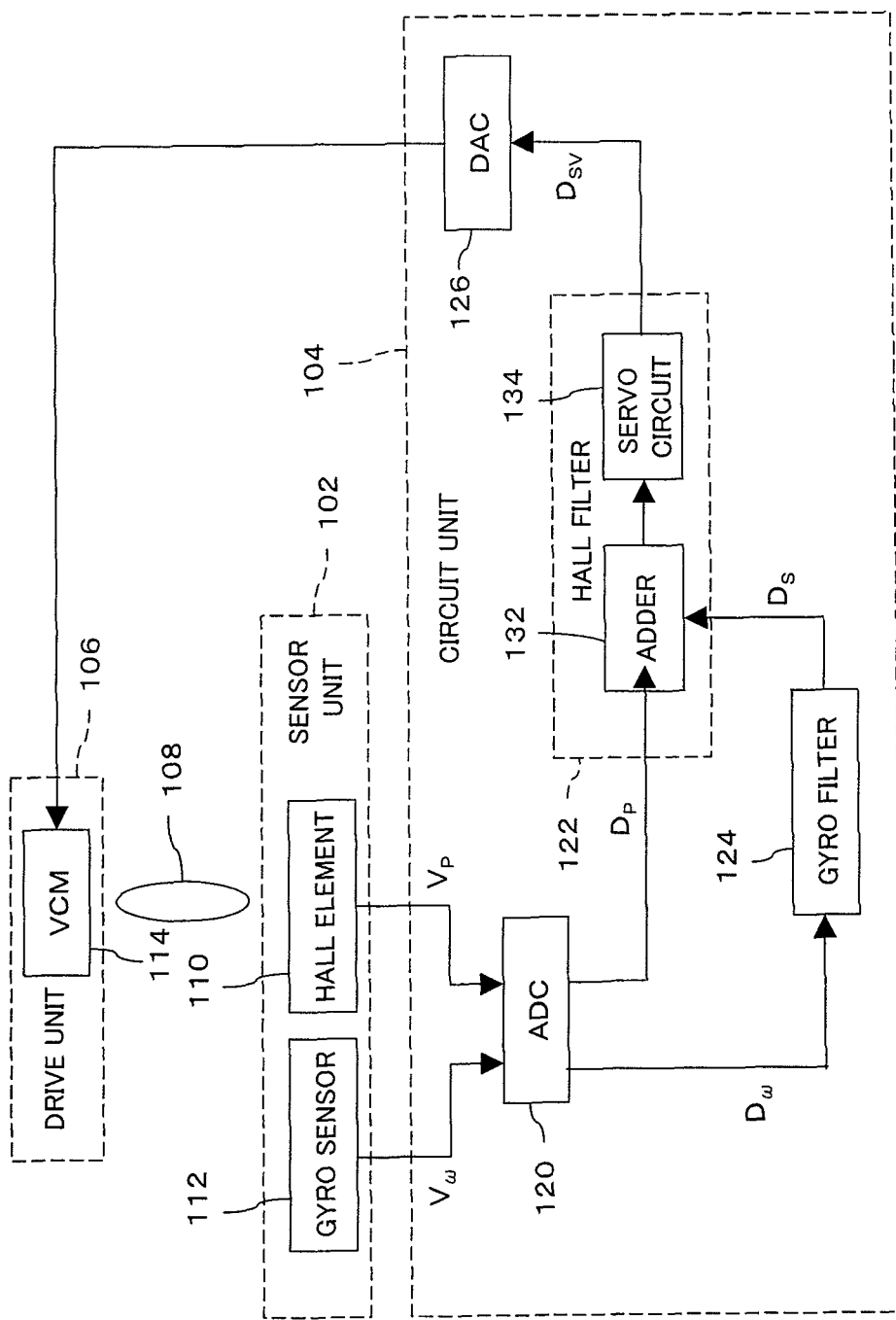
FIG. 3 shows a circuit for camera shake correction according to one or more embodiments of the present invention.

FIG. 3 shows a schematic block diagram of a camera shake correction system. The camera shake correction system has a sensor unit 102, a circuit unit 104, and a drive unit 106. The system adopts a method for camera shake correction by adjusting the position of a correction lens (lens 108), which is provided as a focus adjustment member in an optical system forming an optical image on a light receiving surface of an image-capturing element (not shown).

The sensor unit 102 is composed of Hall elements 110 and gyro sensors 112. The Hall element 110 is a sensor for detecting the position of the lens 108 and generates and outputs a voltage signal Vp to the circuit unit 104 in accordance with distance from the lens 108 on the basis of a magnetic field of a magnet fixed to the lens 108. To detect a 2-dimensional position ($P_P$, $P_Q$) of the lens 108 within a plane (x-y plane) perpendicular to the optical axis, the Hall elements 110 are provided to respectively correspond to the x direction and the y direction, and output the signal $V_P$ respectively for the x direction and the y direction.

The gyro sensor 112 is a sensor (displacement velocity detector) provided for detecting vibration of the camera and outputs to the circuit unit 104 an electric signal $V_\omega$ corresponding to an angular velocity ω as a vibration detection signal corresponding to the displacement velocity of the camera. Two gyro sensors 112 are also provided and respectively output the signal $V_\omega$ for the angular velocity component around the x axis and the angular velocity component around the y axis.

The displaceable lens 108 and the drive unit 106 for displacing the lens 108 form a vibration compensating mechanism. The drive unit 106 is, for example, formed from a voice coil motor (VCM) 114. The VCM 114 controls the position of the lens 108 by linearly displacing the position of a moving coil forming the VCM 114 in accordance with a drive signal generated by the circuit unit 104. To realize 2-dimensional displacement within the x-y plane, a pair of moving coils is provided, each respectively for displacement in the x direction and in the y direction.

The circuit unit 104 has an ADC (A/D converter) 120, a Hall filter 122, a gyro filter 124, and a DAC 126. The circuit unit 104 is configured from logic circuits and is configured, for example, as an ASIC (Application Specific Integrated Circuit).

The ADC 120 inputs the output signals $V_P$ and $V_\omega$ from the Hall elements 110 and the gyro sensors 112, respectively. Using time division, the ADC 120 converts the voltage signals $V_P$ respectively output from the two Hall elements 110 and the voltage signals $V_\omega$ respectively output from the two gyro sensors 112 into position data $D_P$ and angular velocity data $D_\omega$. The A/D conversion of the signals is performed periodically at every servo control period.

Position data $D_P$ generated on the basis of the outputs of the Hall elements 110 is input by the Hall filter 122. On the other hand, the angular velocity data $D_\omega$ generated on the basis of the outputs of the gyro sensors 112 is input by the gyro filter 124.

The gyro filter 124 is a circuit for generating vibration compensating data in accordance with an amount of displacement of the camera. The gyro filter 124 integrates the angular velocity $D_\omega$ to be input spanning a predetermined sampling period at every servo control period and generates data $D_\theta$ in accordance with vibration angle θ of the camera around the x axis and the y axis. The gyro filter 124 generates and outputs vibration compensating data $D_S$ in accordance with the vibration amount respectively corresponding to the x axis and the y axis on the basis of the data D. The vibration compensating data $D_S$ represents data relating to how much the lens 108 is to be displaced in both the x axis and the y axis directions.

The Hall filter 122 has an adder 132 and a servo circuit 134. The adder 132 adds position data $D_P$ from the ADC 120 and vibration compensating data $D_S$ from the gyro filter 124 separately in the x and y directions. From the output data of the adder 132, the servo circuit 134 calculates servo data $D_{SV}$ that corresponds to a required displacement indicating how much the lens 108 is to be displaced from the current position in both the x-axis direction and the y-axis direction. The obtained servo data $D_{SV}$ is supplied to the DAC 126.

The DAC 126 converts servo data $D_{SV}$ output from the Hall filter 122 into an analog voltage signal. The voltage signal output by the DAC 126 is subjected to a predetermined amplification process and applied to the VCM 114. The VCM 114 is driven in a direction where the absolute value of $D_{SV}$ decreases. Thus, a camera in which this system is mounted can obtain a high quality image signal by moving the lens 108 in accordance with camera shake in the image capturing period to compensate for displacement due to camera shake of the subject image on the image-capturing element.

Figure 4:
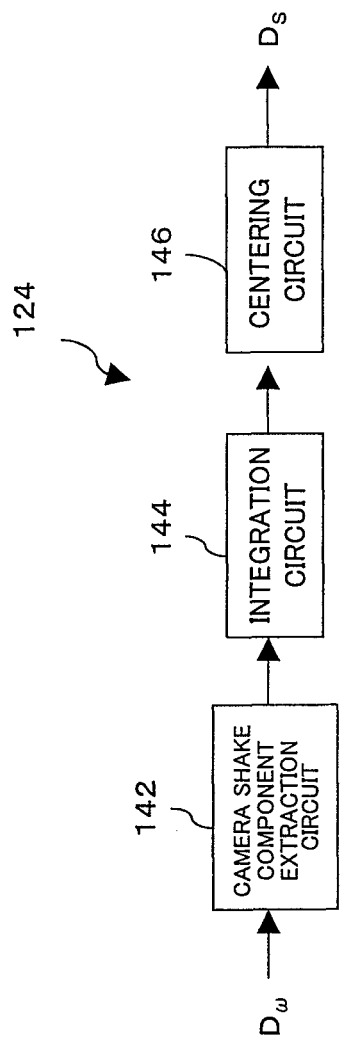
FIG. 4 shows a configuration of a gyro filter according to one or more embodiments of the present invention.

Next, the configuration of the gyro filter 124 will be described. FIG. 4 is a block diagram showing the schematic configuration of the gyro filter 124. The gyro filter 124 has a camera shake component extraction circuit 142, an integration circuit 144, and a centering circuit 146.

The camera shake component extraction circuit 142 is a high-pass filter (HPF) and inputs the time-sequenced angular velocity data $D_\omega$, attenuates the low-frequency component included therein, and extracts a vibration component of a target compensation region. The target compensation region is set to 1 Hz or higher to correspond to the fact that camera shake includes, for example, the low frequencies of approximately 2 Hz to 10 Hz. Namely, the camera shake component extraction circuit 142 attenuates the low-frequency component regarded substantially as a direct current component and passes through components of approximately several Hz. The camera shake component extraction circuit 142 is composed of a digital filter for performing calculations in floating-point format and set with filter characteristics according to a filter coefficient set in a register (not shown).

The integration circuit 144 integrates angular velocity data in floating-point format output by the camera shake component extraction circuit 142 and generates angular data $D_\theta$ representing the amount of displacement of the image-capturing device. The integration circuit 144 can be configured using an LPF and set with filter characteristics according to a filter coefficient set in a register (not shown). It should be noted the angular data $D_\theta$ generated at the integration circuit 144 represents the amount of displacement of the image-capturing device as described hereinabove and can be used as vibration compensating data $D_S$ to the Hall filter 122. However, in the present system, a centering process is further performed with respect to the angular data $D_\theta$ obtained at the integration circuit 144 and the result thereof is supplied to the Hall filter 122 as vibration compensating data $D_S$.

The centering circuit 146 performs a process for correcting the amount of displacement so that it becomes difficult for the lens 108 to reach a movable limit due to a compensation control mechanism. From the angular data $D_\theta$ obtained from the integration process, the centering circuit 146 attenuates a component regarded as direct current having a frequency lower than the lower limit of the target compensation region. In this case, the centering circuit 146 can be configured using an HPF. The HPF for centering is configured from a digital filter and set with filter characteristics according to a filter coefficient set in a register (not shown). Similar to the HPF forming the abovementioned camera shake component extraction circuit 142, the cutoff frequency for the HPF forming the centering circuit 146 is basically set lower than the lower limit of the target compensation region. As described hereinabove, the processed result of the centering circuit 146 becomes the vibration compensating data $D_S$.

Here, in one or more embodiments of the present invention, the gyro sensor 112 detects the signal $V_\omega$ for angular velocity around the x axis and around the y axis. Then, the gyro filter 124 calculates the vibration compensating data $D_S$, which is the amount of movement in the x axis and y axis directions, on the basis of the angular data $D_\theta$ in the x axis and y axis directions calculated from the signal $V_\omega$ and compensates for the image position by movement of the lens 108 in the x axis and y axis directions. The form of compensation is not limited in this manner and it is possible to move the lens 108 also in another direction.

The vibration compensating data $D_S$ output from the centering circuit 146 is input by the adder 132 in the Hall filter 122.

Here, the camera shake component extraction circuit 142, the integration circuit 144, and the centering circuit 146 forming the gyro filter 124 each has a digital filter, which is configured from a first-order IIR filter. Furthermore, these operations require an operation for the X axis and an operation for the Y axis so that the digital filter of FIG. 1 becomes necessary for the X axis operation and for the Y axis operation. In one or more embodiments of the present invention, the gyro filter 124 for camera shake correction has a shared configuration for the X axis operation and the Y axis operation and performs the processes in time division.

Figure 5:
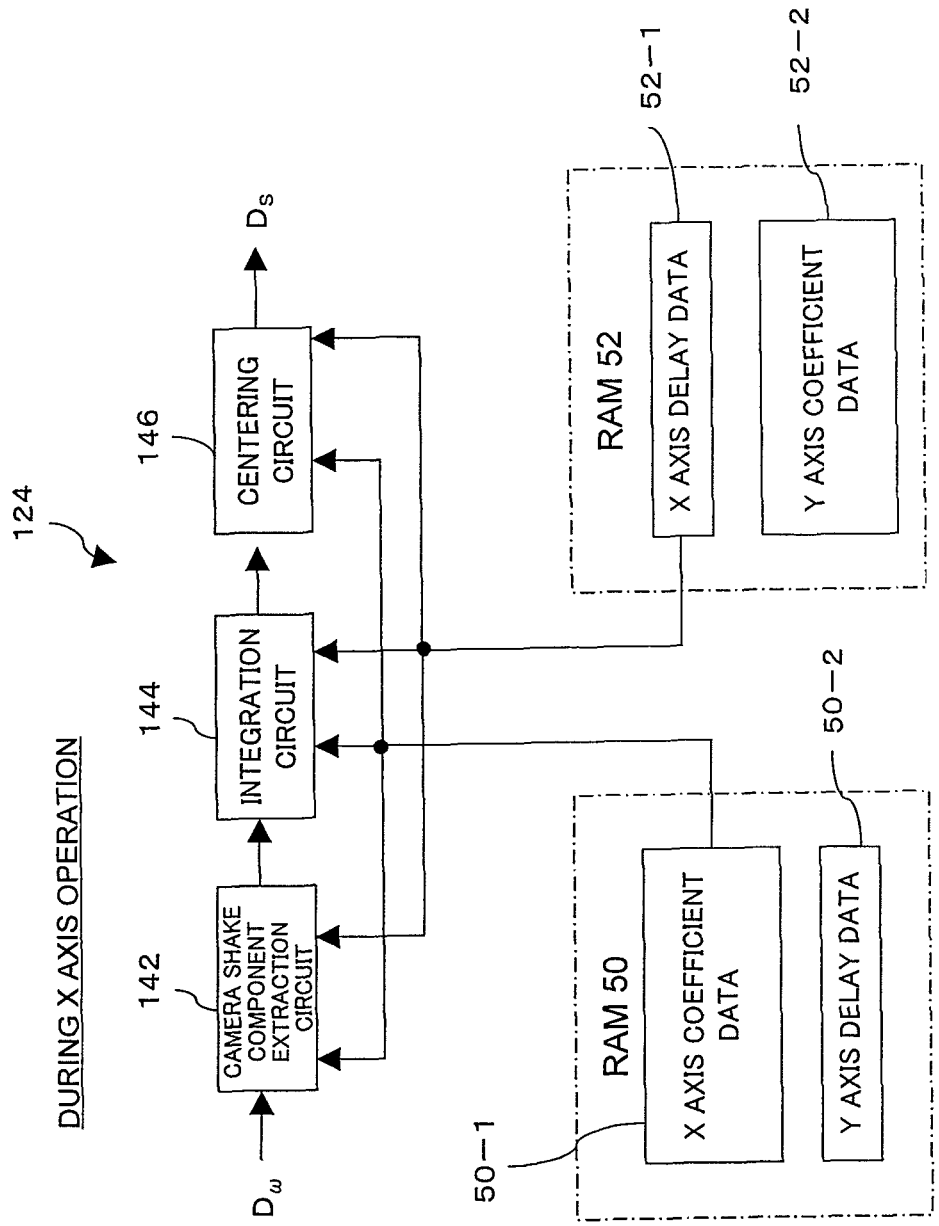
FIG. 5 illustrates a process during X axis operation of the gyro filter according to one or more embodiments of the present invention.
Figure 6:
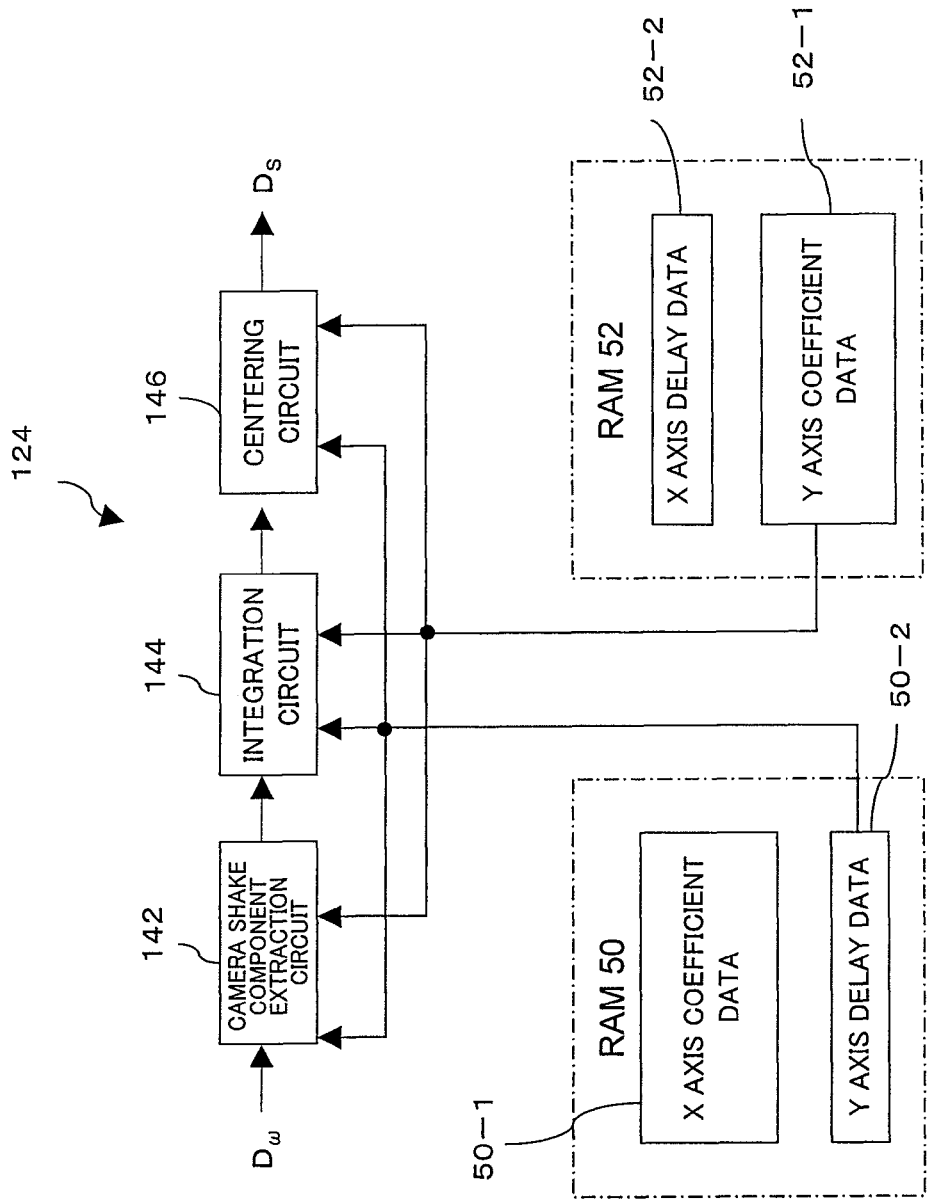
FIG. 6 illustrates a process during Y axis operation of the gyro filter according to one or more embodiments of the present invention.

Namely, as shown in FIG. 5 and FIG. 6, the RAM 50 stores X axis coefficient data in a memory 50-1 and Y axis delay data in a memory 50-2 and the RAM 52 stores X axis delay data in a memory 52-1 and Y axis coefficient data in a memory 52-2.

Then, during X axis operation, as shown in FIG. 5, the coefficient data for the X axis operation is read from the memory 50-1 of the RAM 50 and the delay data for the X axis operation is read from the memory 52-1 of the RAM 52. The read coefficient data and delay data are supplied to the digital filter of the camera shake component extraction circuit 142, the integration circuit 144, and the centering circuit 146, and the operation of the gyro filter 124 for the X axis is performed. Furthermore, as shown in FIG. 6, the delay data for the Y axis operation is read from the memory 50-2 of the RAM 50 and the coefficient data for the Y axis operation is read from the memory 52-2 of the RAM 52. The read coefficient data and delay data are supplied to the digital filters of the camera shake component extraction circuit 142, the integration circuit 144, and the centering circuit 146, and the operation of the gyro filter 124 for the Y axis is performed.

When configuring the gyro filter for camera shake correction, the size of the coefficient data is often larger than the size of the delay data because multiple sets of coefficient data have been prepared in advance for changing the characteristics of the camera shake correction in accordance with the image capture scene. In one or more embodiments of the present invention, because a combination of coefficient data and delay is stored in each RAM, the capacity of the RAMs can be set to be relatively uniform and the efficient use of RAM can be designed. Furthermore, the coefficient data and delay data required for each operation can be simultaneously read from the two RAMs.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims. It is intended that the appended claims cover all such modifications as fall within the true spirit and scope of the invention.

What is claimed is:

1. A digital filter comprising:
a plurality of filters, wherein each of the plurality of filters performs coefficient calculations and delay processing for an input signal and an output signal, obtains the output signal from the input signal, and includes a plurality of coefficient multipliers for multiplying a signal by a predetermined coefficient, a plurality of delay circuits for delaying a signal, and an adder for adding a plurality of signals;
a first memory for storing coefficient data for the plurality of coefficient multipliers of a first filter and storing delay data for the delay circuit of a second filter; and
a second memory for storing coefficient data for the plurality of coefficient multipliers of the second filter and storing delay data for the delay circuit of the first filter.

2. The digital filter according to claim 1, wherein:
said first memory stores a plurality of sets of coefficient data for a plurality of coefficient multipliers of the first filter; and
said second memory stores a plurality of sets of coefficient data for a plurality of coefficient multipliers of the second filter.

3. The digital filter according to claim 2, wherein:
said plurality of filters processes signals of two axes from a gyro for detecting acceleration around two axes of X and Y.

4. The digital filter according to claim 3, wherein:
said first filter processes acceleration of either X axis or Y axis and said second filter processes acceleration of the other axis.

5. The digital filter according to claim 4, wherein:
said first filter and said second filter are configured by utilizing a single filter in time division.

6. The digital filter of claim 1, where in the first and second filters are time divisioned, wherein the first filter is used in a first time division and the second filter is used in a second time division.

7. The digital filter of claim 6, wherein, in the first time division the coefficient data for the plurality of coefficient multipliers of the first filter in the first memory and the delay data for the delay circuit of the first filter in the second memory are read simultaneously from the first and second memories.

8. The digital filter of claim 6, wherein, in the second time division the coefficient data for the plurality of coefficient multipliers of the second filter in the second memory and the delay data for the delay circuit of the second filter in the first memory are read simultaneously from the first and second memories.

9. The digital filter of claim 1, wherein the digital filter is a gyro filter for a camera and comprises a camera shake extraction circuit connected in series with an integration circuit which is further connected in series with a centering circuit, wherein the camera shake extraction circuit receives the output of a gyro.

10. A digital filter, comprising:
a first filter and a second filter, each of the first and second filters including a plurality of series circuits, each of the plurality of series circuits performs coefficient calculations and delay processing for an input signal and produces an output signal from the input signal,
each of the plurality of series circuits includes a plurality of coefficient multipliers for multiplying a signal by a predetermined coefficient, a plurality of delay circuits for delaying a signal, and an adder for adding a plurality of signals;
a first random access memory (RAM) containing coefficient data for the plurality of coefficient multipliers for the plurality of series circuits of the first filter and storing delay data for the delay circuit for the plurality of series circuits of a second filter; and
a second RAM containing coefficient data for the plurality of coefficient multipliers for the plurality of series circuits of the second filter and storing delay data for the delay circuit for the plurality of series circuits of the first filter;
wherein the coefficient data in the first RAM and the delay data in the second RAM are read simultaneously for the first filter, and the coefficient data in the second RAM and the delay data in the first RAM are read simultaneously for the second filter.

11. The digital filter of claim 10, wherein the first and second filters are time divisioned, wherein the first filter is used in a first time division and the second filter is used in a second time division.

12. The digital filter of claim 11, wherein the digital filter is a gyro filter, the first and second filters correspond to respective first and second axes of the gyro filter.

13. The digital filter of claim 12, wherein the series circuits for each of the first and second filters include a camera shake extraction circuit connected in series with an integration circuit which is further connected in series with a centering circuit, wherein the camera shake extraction circuit receives the output of a gyro.

14. The digital filter of claim 10, wherein coefficient data for the plurality of coefficient multipliers for the plurality of series circuits of the first filter in the first RAM is a first set of coefficient data for the first filter, and delay data for the delay circuit for the plurality of series circuits of the second filter in the first RAM is a first set of delay data for the second filter, the first RAM further includes at least one additional set of coefficient data for the first filter and at least one additional set of delay data for the second filter.

15. The digital filter of claim 10, wherein coefficient data for the plurality of coefficient multipliers for the plurality of series circuits of the second filter in the second RAM is a first set of coefficient data for the second filter, and delay data for the delay circuit for the plurality of series circuits of the first filter in the second RAM is a first set of delay data for the first filter, the second RAM further includes at least one additional set of coefficient data for the second filter and at least one additional set of delay data for the first filter.

16. A multi-stage filter, comprising:
a first stage filter including at least one coefficient multiplier that multiples a signal by a coefficient to create a multiplied signal, at least one delay circuit that delays a signal by a delay amount to create a delayed signal, and an adder for adding multiplied and delayed signals to create a first stage output signal;
a second stage filter including at least one coefficient multiplier that multiples a signal by a coefficient to create a multiplied signal, at least one delay circuit that delays a signal by a delay amount to create a delayed signal, and an adder for adding multiplied and delayed signals to create a second stage output signal;
a first random access memory (RAM) containing a plurality of sets of coefficients for first stage filter for the at least one coefficient multiplier of the first stage filter, and a plurality of sets of delay data for the at least one delay circuit of the second stage filter; and
a second RAM containing a plurality of sets of coefficients for second stage filter for the at least one coefficient multiplier of the second stage filter, and a plurality of sets of delay data for the at least one delay circuit of the first stage filter.

17. The multi-stage filter of claim 16, wherein a set of coefficients for the first stage filter in the first RAM and a set of delay data in the second RAM are read simultaneously.

18. The multi-stage filter of claim 16, wherein a set of coefficients for the second stage filter in the second RAM and a set of delay data in the first RAM are read simultaneously.

19. The multi-stage filter of claim 16, wherein the first stage filter and the second stage filter are time divisioned, wherein the first stage filter is used in a first time division and the second stage filter is used in a second time division.

20. The multi-stage filter of claim 16, wherein the first stage output is an input for the second stage filter.

* * * * *